US006526305B1

United States Patent
Mori (10) Patent No.: US 6,526,305 B1
(45) Date of Patent: Feb. 25, 2003

(54) METHOD OF FIBER RECONSTRUCTION EMPLOYING DATA ACQUIRED BY MAGNETIC RESONANCE IMAGING

(75) Inventor: Susumu Mori, Ellicott City, MD (US)

(73) Assignee: The Johns Hopkins University, Baltimore, MD (US)

( * ) Notice: Subject to any disclaimer, the term of this patent is extended or adjusted under 35 U.S.C. 154(b) by 0 days.

(21) Appl. No.: 09/444,346

(22) Filed: Nov. 19, 1999

Related U.S. Application Data
(60) Provisional application No. 60/109,980, filed on Nov. 25, 1998.

(51) Int. Cl.$^7$ .............................................. A61B 5/055
(52) U.S. Cl. ....................... 600/410; 600/419; 128/920; 324/309
(58) Field of Search ................................ 600/410, 419; 382/128; 128/920; 324/307–309, 306

(56) References Cited

U.S. PATENT DOCUMENTS

| | | | | |
|---|---|---|---|---|
| 5,488,297 A | * | 1/1996 | Nakada ....................... | 324/309 |
| 5,539,310 A | * | 7/1996 | Basser et al. ................ | 324/307 |
| 5,560,360 A | * | 10/1996 | Filler et al. .................. | 600/408 |
| 5,969,524 A | | 10/1999 | Pierpaoli et al. | |
| 6,026,316 A | * | 2/2000 | Kucharczyk et al. ....... | 600/420 |

OTHER PUBLICATIONS

Sener, "Diffusion MRI: apparent diffusion coefficient (ADC) values in the normal brain and a classification of brain disorders based on ADC values," (2001) Computerized Medical Imaging and Graphics, 25, pp. 299–326.*

Xue et al., "In Vivo Three–Dimensional Reconstruction of Rat Brain Axonal Projections by Diffusion Tensor Imaging," (1999), Magnetic Resonance in Medicine, 42:1123–1127.*

Golay et al., "High–Resolution Isotropic 3D Diffusion Tensor Imaging of the Human Brain," (2002), Magnetic Resonance in Medicine, 47:837–843.*

Nakada, Tsutomu et al. "Three–Dimensional anisotropy contrast magnetic resonance imaging of the rat nervous system: MR axonography" (1995) Neuroscience Research 22, 389–398.*

Conturo, Thomas E. et al., "Tracking neuronal fiber pathways in the living human brain" (Aug. 1999) Proc. Natl. Acad. Sci. USA vol. 96, pp. 10422–10427.*

* cited by examiner

*Primary Examiner*—Shawna J Shaw
(74) *Attorney, Agent, or Firm*—Edwards & Angell, LLP; Peter F. Corless; William J. Daley, Jr.

(57) ABSTRACT

A method of creating an image of brain fibers includes exposing the brain fibers to a magnetic resonance imaging process. The data acquisition from the magnetic resonance imaging includes the acquisition of diffusion-weighted, images that are later employed to calculate an apparent diffusion constant at each pixel along more than six axes. The data is introduced into a microprocessor which calculates six variable in a diffusion tensor and obtains a plurality of eigen values and eigen vectors. This may be accomplished by employing a diffusion sensor which is diagonalized to obtain three eigen values and three eigen vectors with the six values being subjected to further microprocessing to generate imaging information representing the properties of the fibers. The process in a preferred embodiment includes the initiation of fiber tracking by selecting a pixel for initiation of the same, connecting of pixels and effecting a judgement regarding termination of the pixel tracking in each direction based upon the randomness of the fiber orientation of the adjacent pixels.

38 Claims, 10 Drawing Sheets

(5 of 10 Drawing Sheet(s) Filed in Color)

METHOD OF FIBER RECONSTRUCTION EMPLOYING DATA ACQUIRED BY MAGNETIC RESONANCE IMAGING

This application claims the benefit of U.S. Provisional Application Ser. No. 60/109,980, filed Nov. 25, 1998.

GOVERNMENT SUPPORT

The present invention was supported at least in part by NIH Grant #SN31490.

BACKGROUND OF THE INVENTION

1. Field of the Invention

The present invention provides a method of employing data obtained through magnetic resonance imaging in creating three-dimensional brain fiber reconstructions and, more specifically, it provides such a method which is particularly useful in respect of white matter fibers.

2. Description of the Prior Art

It has been known for many purposes to attempt to image portions of a human or animal's brain for diagnostic, research, or therapeutic purposes. In order to understand the activity of and relationships between multiple cortical regions of the brain, it is important to analyze their physical connectivities, by axonal fibers. The projections of these fibers can be traced in experimental animals by observing axonal degeneration following carefully placed experimental brain lesions or, alternatively, by injecting and subsequently localizing radio-isotopes or other chemicals which are taken up by nerve cells and actively transported along their axons. Comparable human data are necessarily much more limited because they have been obtained only after postmortem examinations of patients with naturally occurring lesions such as injuries or infarcts.

As a result of the foregoing, progress in understanding the structure of cognitive association pathways and their dysfunction in many disorders has been slow due to the lack of a non-invasive method for fiber tracking. Conventional MR imaging can distinguish gray and white matter, but provides no information about the fiber orientation in white matter. Diffusion-weighted MRI allows in vivo mapping of the anisotropic and isotropic diffusional properties of brain water, and has revealed a high degree of diffusional anisotropy in white matter. Although this finding has been tentatively attributed to preferential water diffusion along axons and/or their myelin sheaths, it has not been known to show tracking of neuronal projections.

There remains, therefore, a need for improved methods of imaging white matter fibers in the brain including the brain of a living human being.

SUMMARY OF THE INVENTION

The present invention involves a method of creating an image of brain fibers which includes the data acquisition by the magnetic resonance imaging process and the data processing to generate imaging information relating to the fibers.

The data acquisition by the magnetic resonance imaging contains the acquisition of so-called diffusion-weighted images that are later used for the calculation of apparent diffusion constant at each picture element (pixel) along more than six axes. This can be accomplished by using a pair of magnetic field gradients to sensitize the magnetic resonance imaging. Conventional magnetic resonance imaging scanners are equipped with three magnetic field gradient units. By combining these units and by changing the strength, a series of images sensitized to water diffusion along desired direction can be recorded.

After the data acquisition, the imaging information is transferred to the computer for the fiber analysis. First, intensity of each pixel of diffusion-weighted images with various gradient combination and strength are fitted to calculate six independent variables in a 3×3 diffusion tensor. The diffusion tensor is then diagonalized to obtain three eigenvalues and three eigenvectors. These six values are subjected to the further computer processing to generate images representing the properties of the fibers. This processing preferably consists of three parts: initiation of brain fiber tracking; pixel connecting; and the judgement of the termination of the fibers. For example, a tracking of projections of fibers can be initiated from a point in a three-dimensional space arbitrarily chosen by a user and propagated in both directions according to the direction of the fiber (the eigenvector associated with the largest eigenvalues). Each time the tracking leaves a pixel to the next pixel, judgement is made whether the fiber is continuous or terminated based on randomness of the fiber orientation of the adjacent pixels.

It is an object of the present invention to provide a method for using data acquired by magnetic resonance imaging of a brain in creating a three-dimensional fiber structure for white matter fibers of the brain.

It is a further object of the present invention to provide such a method wherein axonal fiber may be imaged so as to provide images containing details regarding the patient white matter fibers.

It is a further object of the present invention to provide an automated means of converting magnetic resonance imaging data into brain fiber three-dimensional image.

It is a further object of the present invention to provide such a method which may be practiced on living human beings.

These and other objects of the invention will be more fully understood from the following detailed descriptions of the preferred embodiments on reference to the illustrations appended hereto.

BRIEF DESCRIPTION OF THE DRAWINGS

The file of this patent contains atleast one drawing or photograph executed in color. Copies of this patent with color drawing(s) or photograph(s) will be provided by the Patent and Trademark Office upon request and payment of the necessary fee.

DESCRIPTION OF THE PREFERRED EMBODIMENT

As used herein, the term "patient" refers to members of the animal kingdom including human beings.

The terms "fiber" or "fibers" as used herein shall refer to a group of axonal fibers which have at least portions thereof projecting in generally the same direction.

Figure 1A:
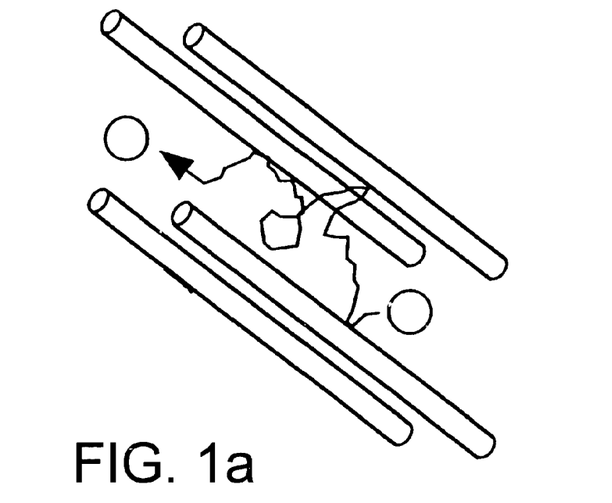
FIGS. 1a and 1b illustrate principles of water diffusion anisotropy as known in the prior art.
Figure 1B:
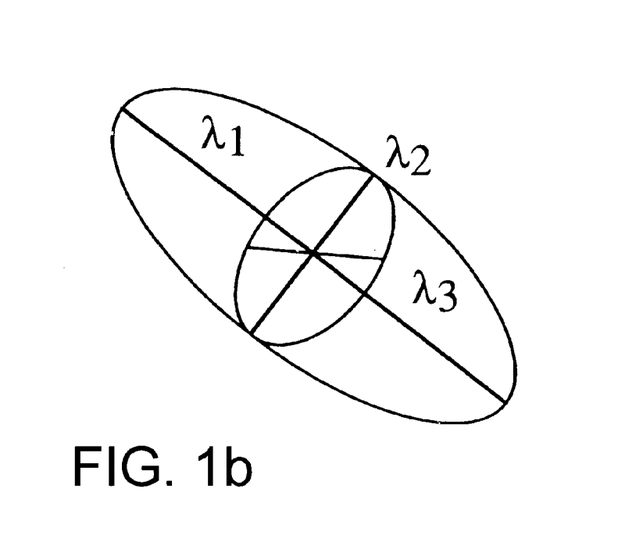

The principle of water diffusion anisotropy of the prior art as compared with axonal projections of the present invention is shown in FIG. 1. FIG. 1a is a schematic view of restricted water diffusion (solid sphere) in an environment with strongly aligned fibers (depicted by bars). The diffusion properties can be quantified by an ellipsoid (FIG. 1b) with three principal axes ($\lambda_1, \lambda_2$, and $\lambda_3$) and a certain orientation of the main axis described by a vector. For a region where axons are aligned (depicted by long cylinders in FIG. 1a), water diffusion be restricted in the direction perpendicular to the axons and consequentially diffuse preferentially in a direction parallel to them. The properties of such water diffusion can be represented mathematically by an ellipsoid, as illustrated in FIG. 1b. This so-called diffusion ellipsoid can be fully characterized by the diffusion constants $\lambda_1, \lambda_2$, and $\lambda_3$ along the three orthogonal principal directions corresponding to the longest, intermediate, and shortest axes, respectively, and the three-dimensional (vector) direction of the longest axis. For example, a case for which $\lambda_1 >> \lambda_2 = \lambda_3$ (anisotropic diffusion) suggests the existence of dense and aligned cylindrical axonal structures, whereas a result of $\lambda_1 = \lambda_2 \lambda_3$ (isotropic diffusion) suggests sparse or unaligned axons. When diffusion is anisotropic, the direction of $\lambda_1$ indicates the preferential fiber orientation within that voxel. All ellipsoid parameters can be obtained from diffusion MRI measurements for each volume element (voxel) of a brain image. The diffusion ellipsoid for a voxel represents an average over all neuronal structures contained within. Although anisotropies have been detected previously in white matter, it previously has not been known to relate these to neuronal trajectories.

Figure 2:
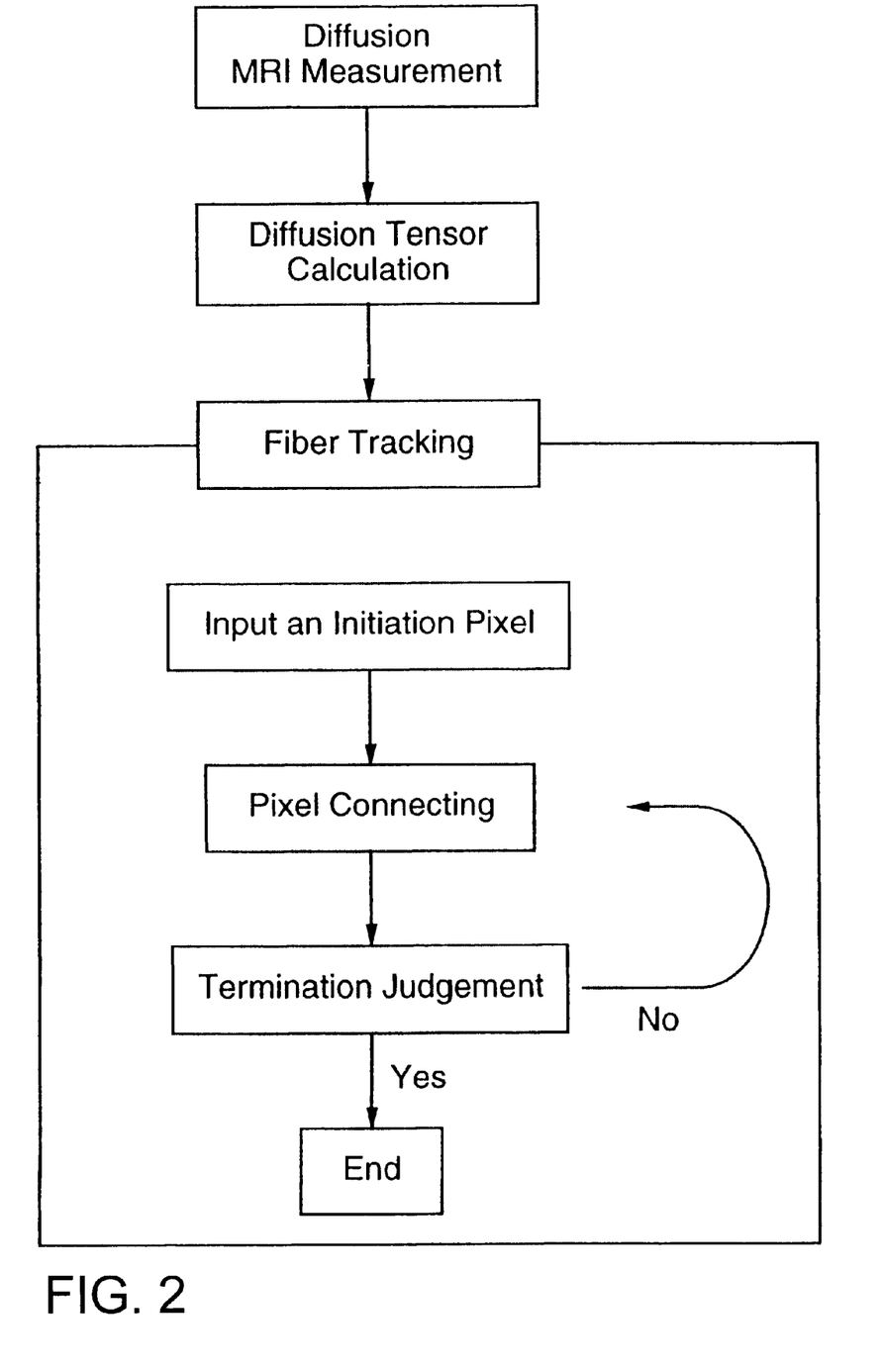
FIG. 2 illustrates a flow diagram showing a sequence of operations of the present invention.

In order to accomplish the three-dimensional reconstruction of axonal fibers, the present invention employs a computer which tracks the fibers in such a three-dimensional space. FIG. 2 illustrates a flow diagram for the reconstruction process. The first block indicates data acquisition by magnetic resonance imaging which involves the acquisition of so-called diffusion-weighted images that are later employed to calculate the apparent diffusion constant at each picture element (pixel) along more than six axes. This can be accomplished by using a pair of magnetic field gradients to sensitize the magnetic resonance imaging. Conventional magnetic resonance imaging scanners are equipped with three magnetic field gradient units. By combining these units and by altering the strength, a series of images sensitized to water diffusion along the desired direction can be recorded. The image information is then introduced into a computer for the fiber analysis. In the diffusion tensor calculation form, the intensity of each pixel of diffusion-weighted images with various gradient combinations and strengths are fitted to calculate six independent variables in a 3×3 diffusion tensor. The diffusion tensor is then diagonalized to obtain three eigen values and three eigen vectors. The images representing the properties of the fibers are then determined by further computer processing of the six values. In the fiber reconstruction or tracking portion of the method, as shown schematically in FIG. 2, the input of an initiation pixel begins the reconstruction process which involves pixel connecting and ultimately judgement or a decision based upon the tracking reaching termination of the fiber in each direction. If the comparison in the computer results in the conclusion that the end of the fiber has been reached ("yes"), that is the end of the process as to that axonal fiber. If not ("no"), the fiber reconstruction process continues.

By way of an example, a reconstruction of projections of fibers can be initiated from a point in three-dimensional space which is arbitrarily selected by a user and propagated in both directions according to the direction of the fiber (the eigen vector associated with the largest eigen value). Each time the tracking leaves a pixel and proceeds to the next pixel, a judgement is made as to whether the fiber is continuous or terminated based on randomness of the fiber orientation of the adjacent pixels.

Figure 3A:
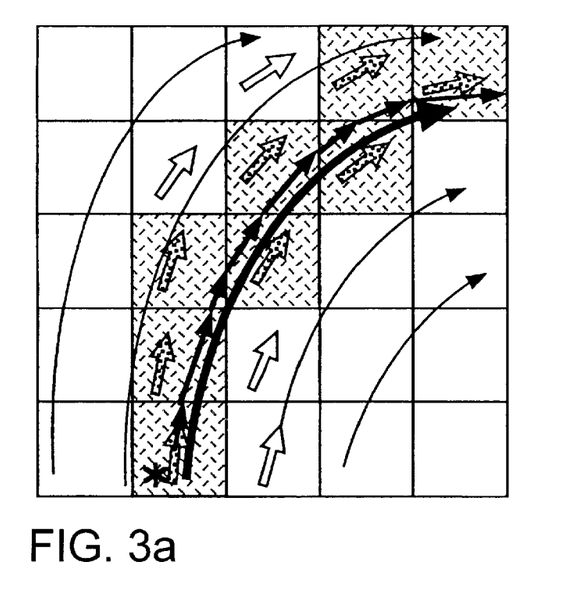
FIGS. 3a through 3c are schematic diagrams of fiber tracking by a first method of the present invention.
Figure 3B:
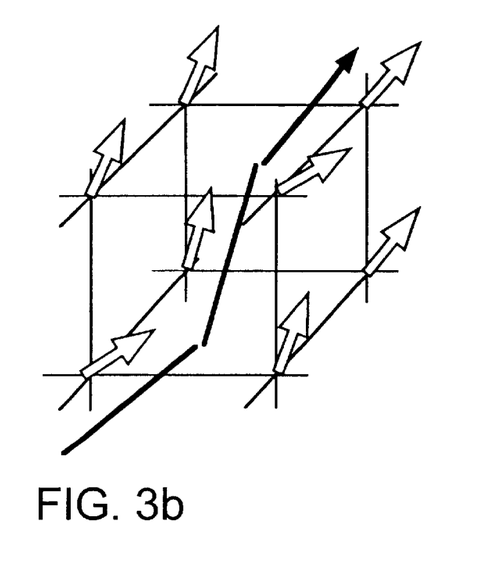
Figure 3C:
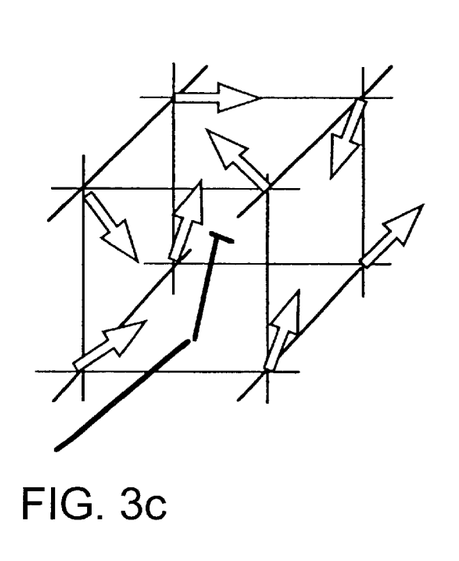

In a first method of fiber reconstruction of the invention, with reference to FIG. 3, the initial point is input by a user in an arbitrary manner and then reconstruction is performed in both forward and backward directions. The actual tracking consists of two stages. The first stage is a decision concerning the pixel connection and then the start and end points of projections are determined as by the flow chart of FIG. 2. FIG. 3a shows an example of the method for the decision-making with respect to the pixel connection in which the tracking follows the direction of eigen vectors associated with the largest eigen values. The curve lines in FIG. 3a represent a method of pixel connection in which curved lines represent axonal projections and the small arrows the direction of eigen vectors associated with the largest eigen values of each pixel. Starting from a pixel indicated by an asterisk in FIG. 3a, connected pixels are shown by shaded pixels. The endpoint of the projection is determined as shown in FIGS. 3b and 3c on the basis of the occurrence of a sudden transition of fiber orientation. The tracking is terminated when the environment is random.

While the endpoint may be determined by several means, one approach to quantifying the severity of such a transition is to use the summation of inner products of nearby data points. A three-dimensional axonal projection is tracked by referencing the distance-weighted group orientation of nearby vectors FIG. 3b. When vector orientation becomes random, as judged quantitatively from summation of the inner products of these vectors, as in Equation 1, the tracking is ended FIG. 3b. The computerized means of performing the process accomplishes this in two stages. In the present method, first, a decision concerning the axonal orientation is made. Then the start and end points of projections are determined. As shown in FIG. 3b, MRI information on fiber orientation is discrete and each data point represents the average orientation of axons within a voxel. The fiber tracking, on the other hand, is performed in a continuous number field by referencing nearby three-dimensional discrete data grids. The endpoint of the projection is judged based on the occurrence of sudden transitions of fiber orientations (FIG. 3c). The severity of such a transition is quantified through a parameter R, presenting the summation of the inner products of nearby data points:

$$R = \sum_{i}^{s} \sum_{j}^{s} \text{abs}(v_{\lambda I_i} \cdot v_{\lambda I_j})/s \qquad 1$$

where $v_{\lambda 1}$, is the unit vector representing the longest principal diffusion axis $\lambda_1$, the index i is the three-dimensional coordinate of a pixel of interest (fiber coordinate) and j are the coordinate of pixels surrounding the pixel i, s is the number of data points referenced. In general, the fiber coordinate, i, is considered to have 26 surrounding points, j.

A point such as I or j may be identified by three numbers each related to reference axis. The term "abs" refers to the number having an absolute value without reference to "+" or "−".

Figure 4A:
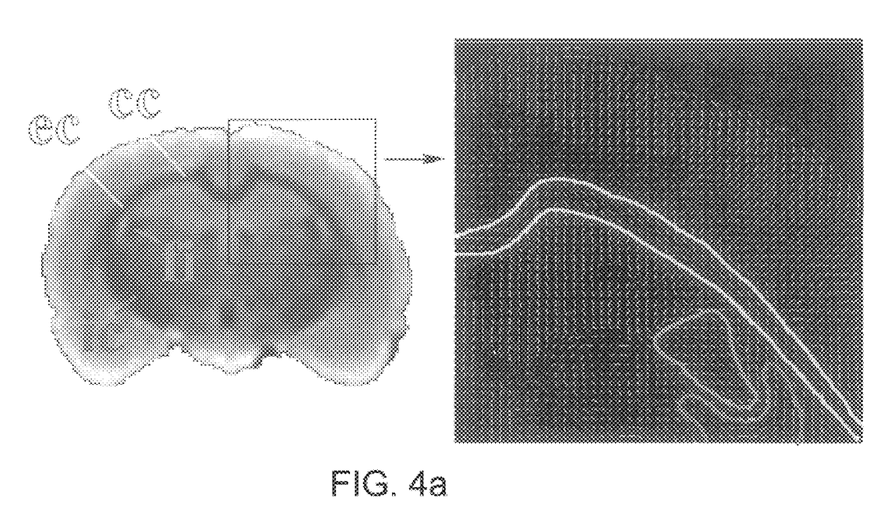
FIGS. 4a and 4b illustrate, respectively, two and three-dimensional presentations of the parietal lobe of a rat brain with representations of prominent brain fiber bundles.

In the experimental work, R values were calculated from the four closest data points and a fiber was judged to be discontinued for R values less than 0.8. There are ways to modify this criterion. For example, the number of data points referred and the method to weight the each point may be modified. The optimal way also depends on the relative size of the image resolution and brain structures. Because of this high threshold used (0.8), only fibers in a strongly aligned environment were tracked. The procedure of mapping the neuronal connections is started through the input of an arbitrary point in three-dimensional space, i.e., "i," after which the extent and distribution of the axonal projections into functional regions is traced in both the orthograde (forward) and retrograde (backward) directions as described above. As an example of this method, eight different pathways were traced in a formalin-fixed rat brain, as illustrated in FIGS. 4 and 5. With reference to FIG. 4, two-dimensional and three-dimensional tracking of prominent axonal projections in the context of the present invention will be considered. As shown in FIG. 4a, two-dimensional vector field presentation in the parietal lobe of a rat brain as localized from a section of the $T_2$-weighted MR image. Regions for prominent fiber bundles are indicated by color lines (yellow: corpus callosum (cc) and external capsule (ec), green: fimbria (fi), and red: internal capsule (ic). The presence of preferential axonal orientation in the gray matter which can be appreciated in FIG. 4a suggests that the fiber reconstruction scheme can also be applied to gray matter.

Alternatively, the endpoint may be defined when the extent of anisotropy is weaker than a threshold value. The extent of the anisotropy can be quantified in various ways using three eigen values, $\lambda_1$, $\lambda_2$, and $\lambda_3$, such as by calculating the ratio between $\lambda_1$ and $\lambda_3$.

Figure 4B:
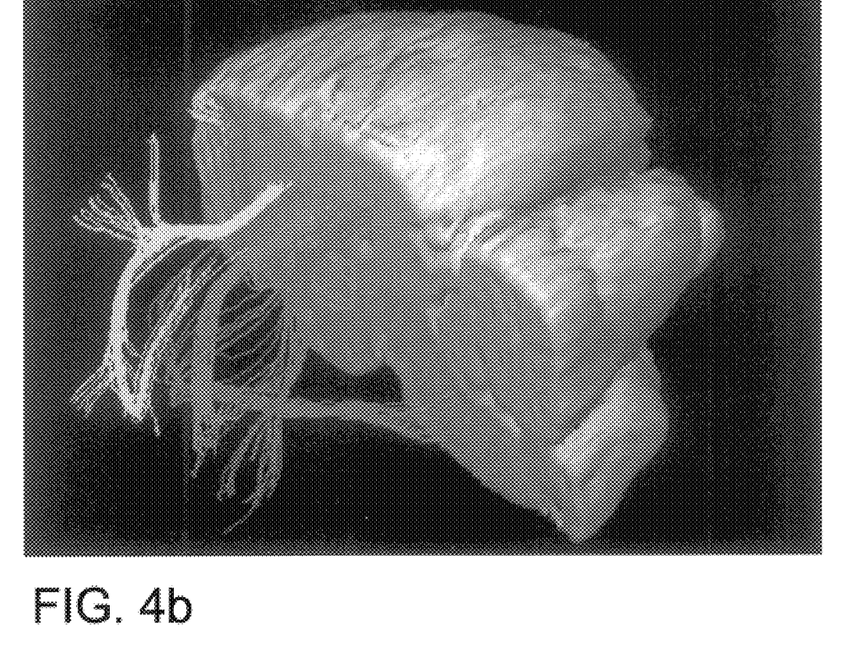
Figure 5A:
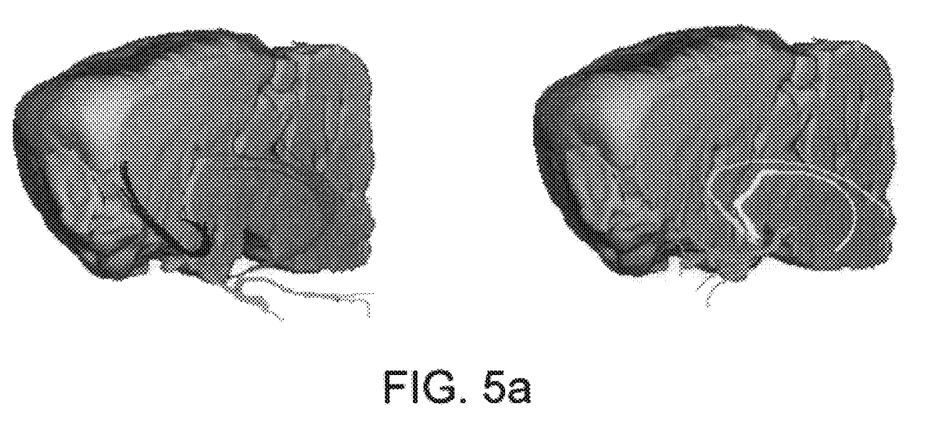
FIGS. 5a through 5f illustrate three-dimensional projections and two-dimensional validation of 8 fiber bundles in a rat brain.
Figure 5B:
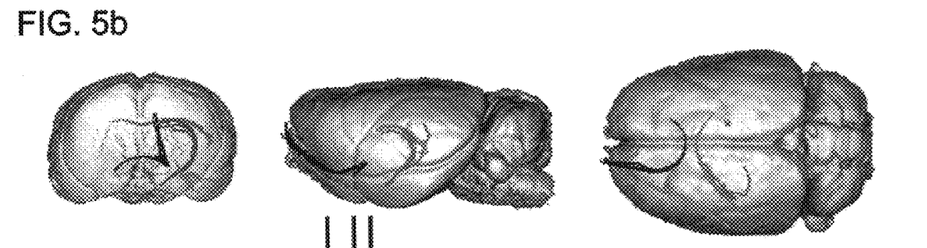
Figure 5C:
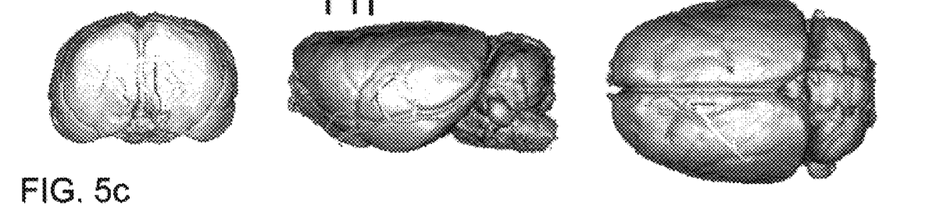
Figure 5D:
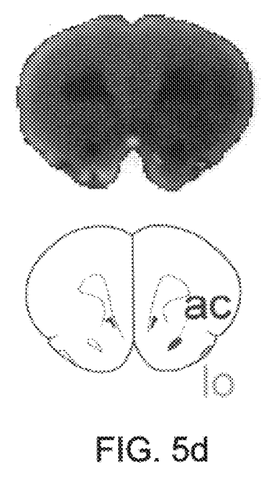
Figure 5E:
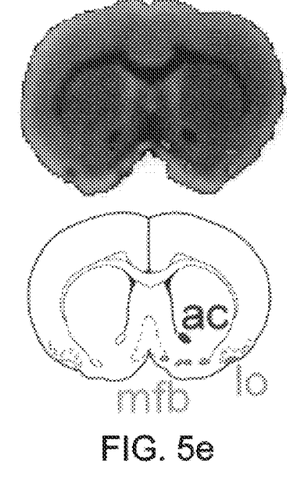
Figure 5F:
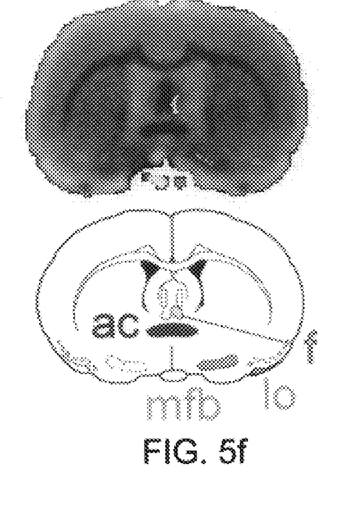

In FIG. 4b, there is shown a three-dimensional presentation of the fibers. Color-coding is the same as in FIG. 4a except for the blue color which shows axons tracked from the corpus callosum into the external capsule. Some axons within the fimbria are tracked into ventral hippocampal commissure, and axons within internal capsule are tracked into the corpus callosum.

FIG. 5 shows a three-dimensional projection and two-dimensional validation of eight fiber bundles in the rat brain.

Figure 6:
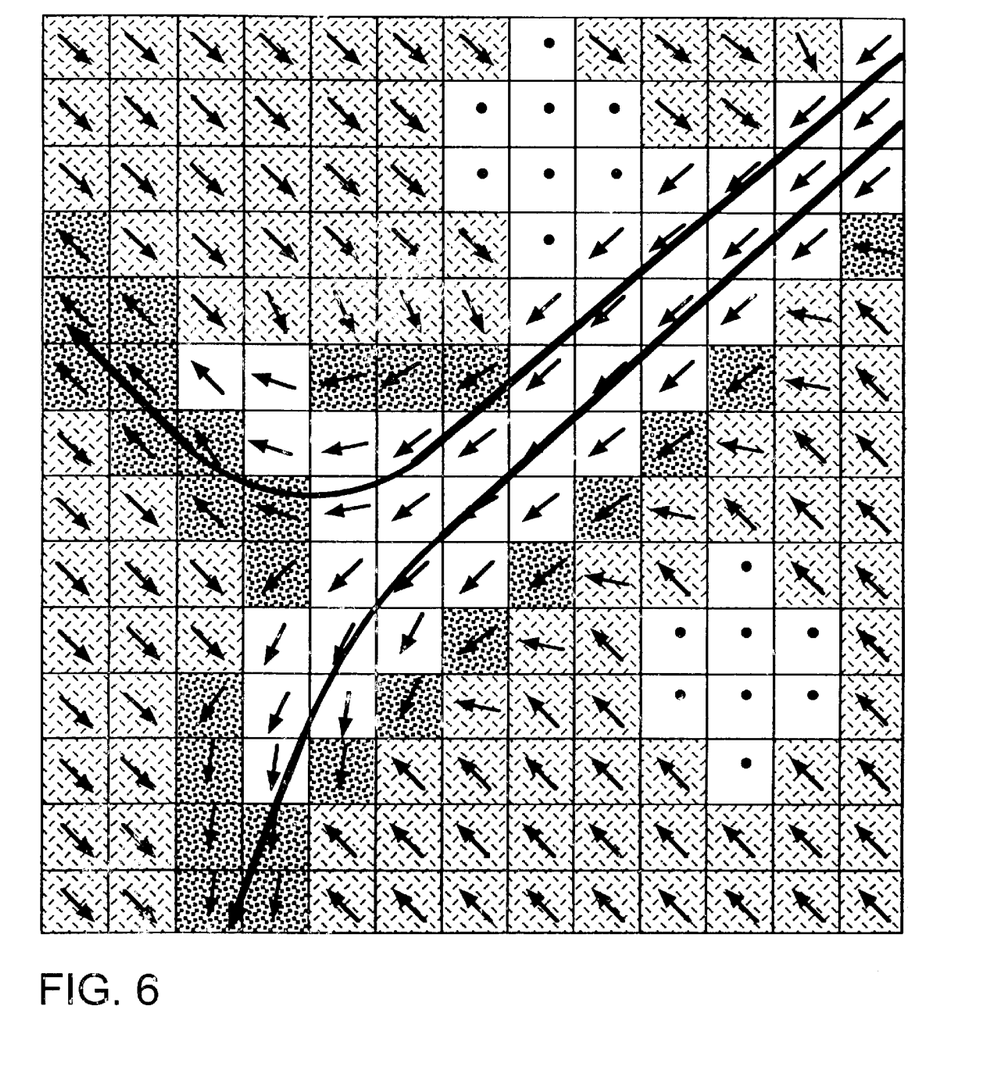
FIG. 6 is a schematic diagram of fiber tracking by a second method of the present invention.
Figure 7:
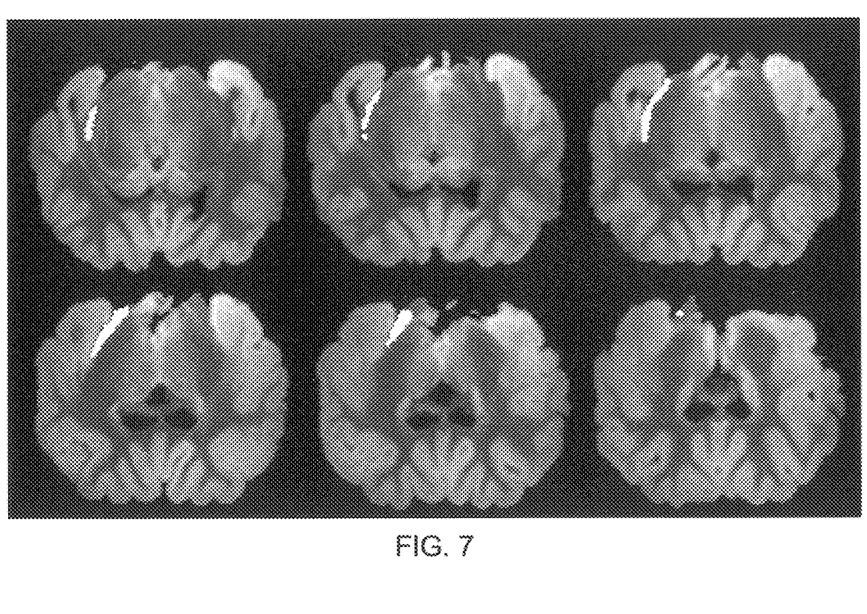
FIG. 7 is an example of an optic tract reconstructed by the second method of this invention.

With reference to FIG. 5, there are shown three-dimensional projections and two-dimensional validation of 8 fiber bundles in a rat brain. The results of the tracking are superimposed on three-dimensional volume images using an oblique angle (FIG. 5a) or three orthogonal angles (FIGS. 5b and 5c). The vertical lines between FIGS. 5b and 5c indicate the positions of the two-dimensional axial slices shown in FIGS. 5d–f. Color codes are; green: fimbria, dark blue: anterior commissure, light blue: medial forebrain bundle, yellow: fornix, white: stria terminalis, pink: stria medullaris, red: optic tract, peach: lateral olfactory tract. A schematic diagram for a second embodiment of the method of the present invention is shown in FIG. 6. In this method a fiber structure is propagated or connected in a 3D from a data point of interest if adjacent pixels have anisotropy higher than a threshold value and an inner product between the pixel of interest is higher than another threshold. An example of this method is shown in FIG. 7. In this example, a data point inside an optic tract of fixed sheep brain was propagated if the adjacent data point had an anisotropy index of higher than 0.38 and an inner product higher than 0.98.

The first method is suitable to delineate the detailed view of fiber structures within a white matter tract and the second method is suitable to characterize the global shape of each white matter tract. The method may also be employed with respect to gray matter structures.

The present invention permits the use of standard MRI imaging procedures and equipment in generating the data employed to create the brain axonal fiber images of the present invention. While the invention may be employed with a wide range of magnetic field gradient intensities, in order to maximize the signal-to-noise ratio, it is preferred that the magnetic field gradient be at least about 1.0 Gauss/cm and preferably greater than 2.2 Gauss/cm.

It will be appreciated that the invention may be employed in connection with diagnostic and research uses, as well as therapeutic uses. For example, in connection with drug therapy employed in diseases such as Leukodystrophies monitoring of the fibers through the imaging procedures of the present invention will provide guidance with respect to ongoing therapy.

It will be appreciated that details regarding the software employed in the present invention need not be provided in the present application as one skilled in the art can readily determine the software for performing the automated procedures. Any suitable computer, such as a microprocessor or personal computer, for example, may be employed.

Whereas particular embodiments of the invention have been described hereinabove, for purposes of illustration, it will be evident to those skilled in the art that numerous variations of the details may be made without departing from the invention as defined in the appended claims.

What is claimed:

1. A method of creating an image of individual brain fibers comprising
   exposing said brain fibers to a magnetic resonance imaging process,
   introducing data acquired from said magnetic resonance imaging process into a computer,
   employing a diffusion tensor to obtain a plurality of scalar values and a plurality of vetors from said data,
   employing said values and said vectors to initiate brain fiber tracking at a pixel of interest, and
   continuing or terminating said fiber tracking based upon a determination regarding whether the fiber is continuous or terminated based on randomness of fiber orientation of adjacent pixels.

2. The method of claim 1 including
   employing as said values three eigen values and employing as said vectors three eigen vectors.

3. The method of claim 2 including
   measurement of diffusion constant along more than six axes at each said pixel of interest.

4. The method of claim 3 including
   obtaining said three eigen values and three eigen vectors by calculating six variables in the diffusion tensor.

5. The method of claim 4 including
   calculating six independent variables in the diffusion tensor, and
   initiating said tracking at a predetermined point selected in three-dimensional space.

6. The method of claim 5 including
   effecting said tracking in orthograde and retrograde directions.

7. The method of claim 6 including
   effecting said tracking along the eigen vector associated with the largest eigen value.

8. The method of claim 1 including
employing said computer to make a determination to continue or terminate tracking based on the relationship $$R = \sum_i^s \sum_j^s \mathrm{abs}(v_{\lambda l_i} - v_{\lambda l_j})/s$$

where $v_{\lambda 1}$ is a unit vector representing the longest principal diffusion axis $v_{\lambda 1}$, the index i is the three-dimensional coordinate of the pixel of interest and j is the coordinates of pixels surrounding the pixel i, s is the number of data points referenced, and the term "abs" refers to a number having an absolute value.

9. The method of claim 8 including terminating said tracking when R is less than about 0.8.

10. The method of claim 1 including
employing information from said tracking to generate a three-dimensional image of said brain fibers.

11. And The method of claim 1 including
determining by said tracking the extent and distribution of projections of said fibers.

12. The method of claim 1 including
employing said method to create image information of fibers disposed in a white matter portion of a brain.

13. The method of claim 1 including
employing said method on a living human being.

14. The method of claim 1 including
employing a continuous number field in effecting said fiber tracking.

15. A method of creating an image of individual brain fibers, comprising the steps of:
acquiring image data of the brain using a magnetic resonance imaging process;
processing the acquired image data; and
wherein said processing includes:
  initiating a process for tracking each brain fiber to be imaged at a pixel of interest, and
  performing one of continuing or terminating the tracking process based upon a determination whether a particular fiber being tracked is continuous or terminated based upon a predetermined criterion relating to one of randomness of fiber orientation from the pixel of interest and anisotropy of the pixel of interest.

16. The method of claim 15, wherein said processing is performed by a computer.

17. The method of claim 15, wherein said acquiring includes acquiring diffusion weighted image data.

18. The method of claim 17, wherein said processing includes applying a diffusion tensor to obtain a plurality of scalar values and a plurality of vectors.

19. The method of claim 18, wherein said plurality of values comprises three eigenvalues and said plurality of vectors comprises three eigenvectors.

20. The method of claim 19, wherein the three eigenvalues and three eigenvectors are obtained by calculating six variables in the diffusion tensor, where the diffusion tensor is a 3×3 diffusion tensor.

21. The method of claim 19, wherein fiber tracking is continued in a direction along the eigenvector associated with the largest eigenvalue.

22. The method of claim 19, wherein the continuing or terminating said tracking process is determined when the extent of anisotropy is less than a threshold value, where the extent of anisotropy is quantified using one or more of the eigenvalues.

23. The method of claim 15, wherein said processing includes initiating the tracking process at a point selected in three-dimensional space.

24. The method of claim 23, wherein said processing includes performing the tracking process in an orthograde direction and a retrograde direction with respect to the selected point.

25. The method of claim 15, wherein the continuing or terminating said tracking process is determined using the following relationship:

$$R = \sum_i^s \sum_j^s \mathrm{abs}(v_{\lambda l_i} - v_{\lambda l_j})/s$$

where $v_{\lambda 1}$ is a unit vector representing the longest principal difusion axis $v_{\lambda 1}$, the index i is the three-dimensional coordinate of the pixel of interest and j is the coordinates of pixels surrounding the pixel i, s is the number of data points referenced, and the term "abs" refers to a number having an absolute value.

26. The method of claim 25, wherein tracking is terminated when R is determined to be less than about 0.8.

27. The method of claim 15, wherein the continuing or terminating said tracking process is determined when the extent of anisotropy is less than a threshold value.

28. The method of claim 27, wherein fiber structure is propagated from a given pixel when adjacent pixels have an anisotropy higher than a threshold value and an inner product between the pixels is higher than another threshold.

29. The method of claim 15, wherein the continuing or terminating said tracking process is further determined based on randomness of fiber orientation of adjacent pixels.

30. The method of claim 15, wherein the tracking process is performed on the brain of a living human being.

31. A method of creating an image of individual brain fibers, comprising the steps of:
acquiring image data of a brain using a diffusion-weighted magnetic resonance imaging process;
processing the acquired image data; and
wherein said processing includes:
  initiating a process for tracking a structure of each brain fiber from a voxel of interest to an adjacent voxel,
  judging each time the tracking process leaves the voxel of interest to an adjacent voxel, whether to continue or terminate the tracking process based upon the acquired image data, and
  propagating a fiber element between adjacent voxels when it is judged to continue the tracking process.

32. The method of claim 31, wherein said judging to continue or terminate said tracking process is determined using the following relationship:

$$R = \sum_i^s \sum_j^s \mathrm{abs}(v_{\lambda l_i} - v_{\lambda l_j})/s$$

where $v_{\lambda 1}$ is a unit vector representing the longest principal dision axis $v_{\lambda 1}$, the index i is the three-dimensional coordinate of the voxel of interest and j is the coordinates of pixels surrounding the pixel i, s is the number of data points referenced, and the term "abs" refers to a number having an absolute value.

33. The method of claim 31, wherein said judging to continue or terminate said tracking process is determined by comparing an extent of anisotropy to a threshold value.

34. The method of claim 31, wherein said judging to continue or terminate said tracking process is determined based on randomness of fiber orientation of adjacent pixels.

35. A method of creating an image of individual brain fibers, comprising the steps of:
acquiring diffusion-weighted image data of a brain using a magnetic resonance imaging process;
processing the acquired image data with a computer; and
wherein said processing includes:
initiating a process for tracking a structure of each brain fiber to be imaged,
judging each time the tracking process leaves a pixel of interest to an adjacent pixel in three-dimensional space, whether to continue or terminate the tracking process, said judging being based on a predetermined criterion relating to one of randomness of fiber orientation from the pixel of interest and anisotropy of the pixel of interest,
propagating a fiber element so as to connect the adjacent pixels when said judging determines to continue the tracking process, and
not propagating a fiber between the adjacent pixels when said judging determines to terminate the tracking process.

36. The method of claim 35, wherein said judging to continue or terminate said tracking process is determined using the following relationship:

$$R = \sum_{i}^{s} \sum_{j}^{s} \text{abs}(v_{\lambda 1_i} - v_{\lambda 1_j})/s$$

where $v_{\lambda 1}$ is a unit vector representing the longest principal diffusion axis $v_{\lambda 1}$, the index i is the three-dimensional coordinate of the pixel of interest and j is the coordinates of pixels surrounding the pixel i, s is the number of data points referenced, and the term "abs" refers to a number having an absolute value.

37. The method of claim 35, wherein said judging to continue or terminate said tracking process is determined by comparing the extent of anisotropy to a threshold value.

38. The method of claim 35, wherein said judging to continue or terminate said tracking process is further determined based on randomness of fiber orientation of adjacent pixels.

* * * * *